(12) United States Patent
Tarsa et al.

(10) Patent No.: US 7,005,679 B2
(45) Date of Patent: Feb. 28, 2006

(54) MULTIPLE COMPONENT SOLID STATE WHITE LIGHT

(75) Inventors: Eric Joseph Tarsa, Goleta, CA (US);
Michael Dunn, Morrisville, NC (US);
Bernd Keller, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 10/427,274

(22) Filed: May 1, 2003

(65) Prior Publication Data

US 2004/0217364 A1    Nov. 4, 2004

(51) Int. Cl.
*H01L 21/00*    (2006.01)

(52) U.S. Cl. .............................. 257/89; 257/88; 257/98; 257/100; 257/200; 257/201; 438/22; 438/25; 438/28; 315/246; 362/800

(58) Field of Classification Search ............... 257/89, 257/90, 91, 88, 98, 103, 100, 200, 201; 362/237, 362/800; 438/22, 25, 28; 315/246
See application file for complete search history.

(56) References Cited

U.S. PATENT DOCUMENTS

| | | | |
|---|---|---|---|
| 5,959,316 A | 9/1999 | Lowery | 257/98 |
| 6,234,648 B1 * | 5/2001 | Borner et al. | 362/235 |
| 6,278,135 B1 * | 8/2001 | Srivastava et al. | 257/98 |
| 6,294,800 B1 * | 9/2001 | Duggal et al. | 257/89 |

(Continued)

FOREIGN PATENT DOCUMENTS

| | | | |
|---|---|---|---|
| EP | 1160883 A | 12/2001 | |
| JP | 20011111114 | * | 4/2001 |
| WO | WO 0169692 A | 9/2001 | |

OTHER PUBLICATIONS

Nichia Corporation White LED, Part Nos. NSPW300BS and NSPW312BS, Nov. 12, 1999, High Brightness LEDs.

*Primary Examiner*—Nathan J. Flynn
*Assistant Examiner*—Fazli Erdem
(74) *Attorney, Agent, or Firm*—Koppel, Jacobs, Patrick & Heybl

(57) ABSTRACT

A white light emitting lamp is disclosed comprising a solid state ultra violet (UV) emitter that emits light in the UV wavelength spectrum. A conversion material is arranged to absorb at least some of the light emitting from the UV emitter and re-emit light at one or more different wavelengths of light. One or more complimentary solid state emitters are included that emit at different wavelengths of light than the UV emitter and the conversion material. The lamp emits a white light combination of light emitted from the complimentary emitters and from the conversion material, with the white light having high efficacy and good color rendering. Other embodiments of white light emitting lamp according to the present invention comprises a solid state laser instead of a UV emitter. A high flux white emitting lamp embodiment according to the invention comprises a large area light emitting diode (LED) that emits light at a first wavelength spectrum and includes a conversion material. A plurality of complimentary solid state emitters surround the large area LED, with each emitter emitting light in a spectrum different from the large area LED and conversion material such that the lamp emits a balanced white light. Scattering particles can be included in each of the embodiments to scatter the light from the emitters, conversion material and complimentary emitters to provide a more uniform emission.

38 Claims, 8 Drawing Sheets

U.S. PATENT DOCUMENTS

| | | | |
|---|---|---|---|
| 6,350,041 B1 * | 2/2002 | Tarsa et al. | 362/231 |
| 6,577,073 B1 * | 6/2003 | Shimizu et al. | 315/246 |
| 2001/0002049 A1 * | 5/2001 | Reeh et al. | 257/103 |
| 2002/0070681 A1 * | 6/2002 | Shimizu et al. | 315/246 |
| 2003/0026096 A1 | 2/2003 | Zwaschka et al. | |
| 2003/0067773 A1 | 4/2003 | Marshall et al. | |

* cited by examiner

MULTIPLE COMPONENT SOLID STATE WHITE LIGHT

BACKGROUND OF THE INVENTION

1. Field of the Invention

This invention relates to light emitting diodes (LEDs) and more particularly to an apparatus with multiple LEDs that in combination produce white light.

2. Description of the Related Art

Light emitting diodes (LEDs) are an important class of solid-state devices that convert electric energy to light. They generally comprise an active layer of semiconductor material sandwiched between two oppositely doped layers. When a bias is applied across the doped layers, holes and electrons are injected into the active layer where they recombine to generate light. Light is emitted omnidirectionally from the active layer and from all surfaces of the LED. Recent advances in LEDs (such as nitride based LEDs) have resulted in highly efficient light sources that surpass the efficiency of filament-based light sources, providing light with equal or greater brightness in relation to input power.

One disadvantage of conventional LEDs used for lighting applications is that they cannot generate white light from their active layers. One way to produce white light from conventional LEDs is to combine different wavelengths of light from different LEDs. For example, white light can be produced by combining the light from red, green and blue emitting LEDs, or combining the light from blue and yellow LEDs.

One disadvantage of this approach is that it requires the use of multiple LEDs to produce a single color of light, increasing the overall cost and complexity. In addition, the different colors of light are often generated from different types of LEDs fabricated from different material systems. Combining different LED types to form a white lamp can require costly fabrication techniques and can require complex control circuitry since each device may have different electrical requirements and may behave differently under varied operating conditions (e.g. with temperature, current or time).

More recently, the light from a single blue emitting LED has been converted to white light by surrounding the LED with a yellow phosphor, polymer or dye, with a typical phosphor being cerium-doped yttrium aluminum garnet (Ce: YAG). [See Nichia Corp. white LED, Part No. NSPW300BS, NSPW312BS, etc.; See also U.S. Pat. No. 5,959,316 to Hayden, "Multiple Encapsulation of Phosphor-LED Devices"]. The surrounding phosphor material "downconverts" the wavelength of at least some of the LED light, changing its color. For example, if a nitride-based blue emitting LED is surrounded by a yellow phosphor, some of the blue light passes through the phosphor without being changed while a substantial portion of the remaining light is downconverted to yellow. The LED will thus emit both blue and yellow light, which combine to provide a white light.

This approach has been successfully used to commercialize white LEDs for a variety of applications such as flashlights, indicator lights, display backlighting, and architectural lighting. However, conventional blue LEDs are too dim for many general lighting applications that currently make use of filament-based or fluorescent lamps. While improvements in blue LED efficiency and output power would be beneficial in increasing the light output from white LEDs, a number of other factors exist which limit the performance of such devices. For example, phosphor materials have a finite conversion efficiency, resulting in "conversion loss" since a portion of the absorbed light is not re-emitted as downconverted light. Additionally, each time a higher energy (e.g., blue) photon is converted to a lower energy (e.g., yellow) photon, light energy is lost (Stokes loss), resulting in an overall decrease in white LED efficiency. This reduction in efficiency increases as the gap between the wavelengths of the absorbed and re-emitted (downconverted) light increases. Finally, for blue LEDs to emit an output light flux sufficient for room illumination, the LED chips themselves can become very hot, causing damage the component device layers of the LED chip itself, or degrading surrounding encapsulation or downconverting media.

Another disadvantage of the above white light emitter arrangements (red+green+blue LEDs or blue LEDs combined with yellow phosphors) is that they do not produce the optimal spectral emission necessary for both high efficacy and high color rendering. Simulations of white emitters show that high efficacy and color rendering can be achieved with an output light spectrum consisting of spectrally narrow emission in the blue and red regions, with a slightly broader emission in the green region.

In the case of the red+green+blue LED lamps, the spectral emission lines of the component LEDs are typically narrow (e.g. 10–30 nm full width at half maximum (FWHM)). While it is possible to achieve fairly high values of efficacy and color rendering with this approach, wavelength ranges exist in which it is difficult to obtain high-efficiency LEDs (e.g. approximately 550 nm). As a result, it is difficult to achieve both high efficacy and high color rendering index with low manufacturing cost and high yield. This can be particularly problematic when spectral requirements call for high efficiency green LEDs, since such LEDs have only been realized in the (In, Ga, Al)N system and are typically subject to low yield and strong wavelength and emission variations with operating conditions such as drive current and temperature. While more simplified white lamps may be realized using only two LEDs emitting at complimentary colors (e.g. blue, yellow), it is exceedingly difficult to achieve high color rendering coefficients in such lamps, primarily due to the lack of any red light in the resulting spectrum.

In the case of blue LEDs combined with yellow phosphor, the resulting white light is produced without a red light source. Since the resulting light is typically deficient in one of the primary colors, lamps fabricated in this manner display poor color rendering.

The desired spectrum can be more closely achieved using a combination of a blue LED with two separate phosphors emitting in the green and red spectral regions, or using an ultra violet LED with red, green and blue phosphors. However, suitable red phosphors having high conversion efficiency and the desired excitation and emission characteristics have yet to be reported. Even if such red phosphors were available, they would be subject to significant energy (Stokes) losses due to the conversion of high energy blue or UV photons to lower energy red photons.

Patent Publication No. U.S. 2002/0070681 A1 to Shimizu discloses an LED lamp exhibiting a spectrum closer to the desired spectrum. The lamp has a blue LED for producing a blue wavelength light, a red emitting LED, and a phosphor which is photoexcited by the emission of the blue LED to exhibit luminescence having an emission spectrum wavelength between the blue and red wavelength spectrum. The phosphor is preferably a yellow or green emitting phosphor and in the embodiments shown, the phosphor covers both the red and blue LEDs.

One of the disadvantages of the Shimizu lamp is that blue LEDs are not as efficient as other LEDs emitting at other wavelength spectrums and a limited number of phosphors are available for luminescence from a blue wavelength of light. Another disadvantage is that with red and blue LEDs placed side by side, the projected light may have an asymmetric appearance such that the light appears red on one side and blue on the other. Since phosphor particles typically must be on the order of at least a few microns diameter to achieve high conversion efficiency (i.e., much larger than the wavelength of blue or yellow light) and particles which are larger than the wavelength of light are poor scatterers, covering one or both of the LEDs with phosphor generally does not adequately scatter the LED light to combine the different wavelengths. This can be a particular problem with large area LEDs used for high power, high output.

Another disadvantage of a number of the embodiments disclosed in Shimizu is that they show blue and red LEDs placed on top of one another and then covered by the phosphor. This can result in the shorter wavelength blue light being absorbed by the component device layers (e.g., active layers, metallization layers) of the red LED device, thereby decreasing the overall efficiency of the lamp. Also, by covering the red LED with phosphor some of the phosphor particles may absorb some of the red light, which can result in a loss of efficiency because it is generally not possible to "up-convert" the absorbed red light to higher energy green light in an efficient manner.

Shimizu also discloses an optical lens as part of its lamp, with the inside surface of the lens being roughened to increase mixing of the LED light. Such approaches are generally not effective and can decrease efficiency by interfering with the purpose of the lens, which is to reduce backscattering of light at the lens/air interface and possible subsequent re-absorption within the body of the lamp or LED.

Solid-state semiconductor lasers convert electrical energy to light in much the same way as LEDs. They are structurally similar to LEDs but include mirrors on two opposing surfaces, one of which is partially transmissive. In the case of edge emitting lasers, the mirrors are on the side surfaces; the mirrors provide optical feedback so that stimulated emission can occur. This stimulated emission provides a highly collimated/coherent light source. A vertical cavity laser works much the same as an edge emitting laser but the mirrors are on the top and the bottom. It provides a similar collimated output from its top surface. Some types of solid-state lasers can be more efficient than LEDs at converting electrical current to light.

SUMMARY OF THE INVENTION

The present invention seeks to provide solid-state white emitting lamps with high efficacy and good color rendering. One embodiment of a white light emitting lamp according to the present invention comprises a solid state ultra violet (UV) emitter (e.g., laser or LED) that emits light in the UV wavelength spectrum. A conversion material is arranged to absorb at least some of the light emitting from the UV emitter and re-emit light at one or more different wavelengths of light. One or more complimentary solid-state emitters are included that emit wavelength spectrums of light that are different than the UV emitter and the conversion material. The lamp emits a white light combination of light emitted from the complimentary emitters and from the conversion material, with the white light having high efficacy and good color rendering.

A second embodiment of white light emitting lamp according to the present invention comprises a solid-state laser emitting light in a first wavelength spectrum. A conversion material is arranged to absorb at least some of the light emitting from the laser and re-emits light at one or more different wavelength spectrums of light. One or more complimentary solid-state emitters are included that emit wavelengths of light different than the laser and the conversion material. The lamp emits a white light combination of light emitted from the laser, complimentary emitters, and conversion material, the white light having high efficacy and good color rendering. The lamp may also incorporate various optics or scattering materials/surfaces to promote mixing and dispersion or mixing and focusing of the component light colors.

Another embodiment of a white light emitting lamp according to the present invention comprises a first solid state emitter that emits light in a first wavelength spectrum. A conversion material is included to absorb at least some of the light from the first solid-state emitter and emit light at one or more different wavelength spectrums. One or more complimentary emitters are included with each emitting light at a wavelength spectrum different from said first wavelength spectrum and said conversion material wavelength spectrums. Scattering elements (such as particles, microviods, etc.) are arranged to scatter the light from the first emitter, conversion material and complimentary emitters. The lamp emits a uniform white light combination of light from the first emitter, conversion material and complimentary emitters.

An embodiment of a high flux white emitting lamp according to the present invention comprises a large area light emitting diode (LED) that emits light at a first wavelength spectrum. A conversion material is arranged to absorb at least some of the light from the large area LED and re-emit at least one wavelength light in a spectrum different from the first wavelength spectrum. A plurality of complimentary solid-state emitters surround the large area LED, with each emitter emitting light in a spectrum different from the large area LED and conversion material. The lamp emits a balanced and uniform white light combination of light from the large area LED, conversion material and complimentary emitters. The white light also has high efficacy and good color rendering.

One embodiment of a method for producing white light with high efficacy and good color rendering according to the present invention comprises generating light in the UV wavelength spectrum and passing the UV light through a conversion material that absorbs the UV light and re-emits light at one or more different wavelength spectrums. The method further comprises generating complimentary light at one or more wavelength spectrums, each of which is different from the conversion material wavelength spectrums. The conversion material light and the complimentary light are combined to generate white light with high efficacy and good color rendering.

Another method for producing white light with high efficacy and good color rendering, comprises generating laser light that is passed through a conversion material that absorbs at least some of the laser light and re-emits light at one or more different wavelength spectrums. The method further comprises generating complimentary light at one or more wavelength spectrums that is different from the wavelength spectrum for the conversion material light and combining the conversion material light and said complimentary light to generate white light with high efficacy and good color rendering.

These and other further features and advantages of the invention will be apparent to those skilled in the art from the following detailed description, taken together with the accompanying drawings, in which:

DETAILED DESCRIPTION OF THE INVENTION

White Lamp Using UV Emitters

Figure 1:
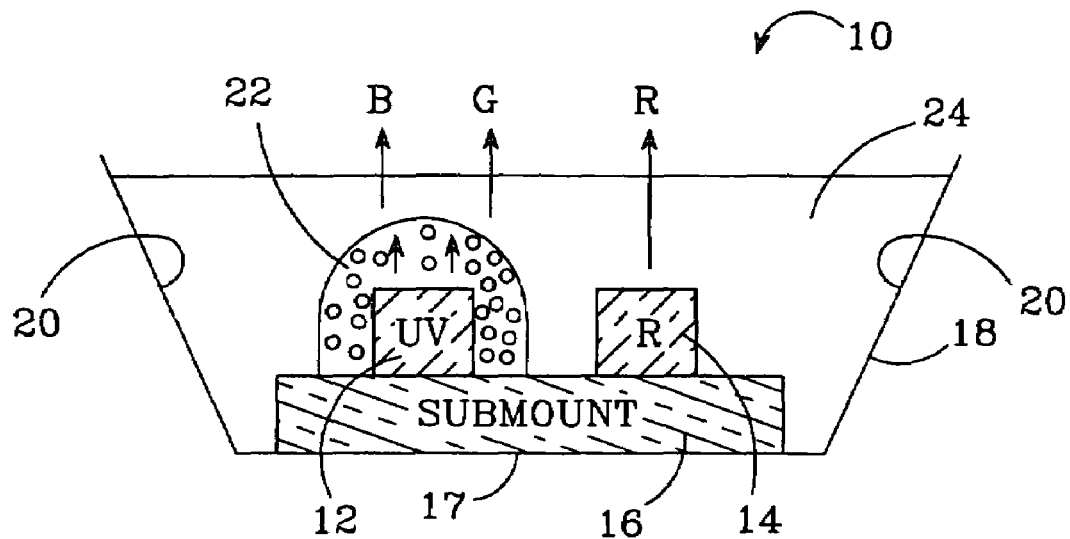
FIG. 1 is a sectional view of one embodiment of a lamp according to the present invention comprising a red LED, a UV LED, and conversion material covering the UV LED.

FIG. 1 shows one embodiment of a multi-component solid-state lamp white lamp 10 constructed in accordance with the invention. It comprises a first light emitter 12 that emits in the ultraviolet wavelength spectrum. Alternatively, the first light emitter 12 can emit light in other "short" wavelength spectrums. The emitter 12 is preferably a light emitting diode (LED), but it can also be other emitters, such as a solid-state laser or organic light emitting diode. The lamp 10 further comprises a complimentary second light emitter 14 that emits in the red wavelength spectrum and is also preferably a LED, but can also be a solid-state laser or organic light emitting diode.

The details of operation and fabrication of conventional LEDs are known and are only briefly discussed. Conventional LEDs can be fabricated from a number of material systems by known methods, with a suitable method being fabrication by Metal Organic Chemical Vapor Deposition (MOCVD). LEDs typically have an active layer sandwiched between two oppositely doped layers that are either doped p-type or n-type. The top layer of the LED is usually p-type and bottom layer 13 is usually n-type, although LEDs also work if the layers are reversed. The p-type and n-type layers have respective contacts that each have a lead to apply a bias across p- and n-type layers. This bias results in the active layer emitting light omnidirectionally. The entire LED can be grown on a substrate.

The first and second LEDs 12, 14 are mounted on a submount 16 for mechanical stability. The submount 16 can also contain electrical circuitry for controlling the relative amount of current or power applied to the respective LEDs 12, 14, or to otherwise modify the electric signal applied to the LEDs 12, 14. The submount 16 can also contain components and circuitry to make the lamp resistant to electrostatic shock. Depending on the particular embodiment, one or both of the LEDs 12, 14 can be in electrical contact with the submount 16. The submount 16 is mounted at the horizontal base 17 of "metal cup" 18 that typically has conductive paths (not shown) for applying a bias across the contacts on the LEDs 12, 14, to cause each of the LEDs to emit light.

The bias can either be applied directly to the LEDs along the conductive paths or it can be applied to the LEDs fully or partially through the submount 16 and its electronic circuitry. The cup 18 can have a reflective surface 20 that reflects light emitted from the LEDs 12,14 so that it contributes to the light emitted from the lamp 10.

The lamp 10 further comprises a conversion material 22 that surrounds the first UV emitter 12 except for the surface of the emitter 12 that is adjacent to the submount. The material 22 can be one or more flourescent or phosphorescent material such as a phosphor, flourescent dye or photoluminescent semiconductor. The material 22 absorbs at least some of the electromagnetic radiation (light) emitted by the UV LED 12 and re-emits at least some of the absorbed radiation at one or more wavelength spectrums that are different from the absorbed wavelength. In the case of the UV emitter 12, the conversion material 22 has a combination of materials that absorb UV light and re-emit light in the green and blue wavelength spectrums. Different materials can be used for absorbing the UV light and re-emitting green light, with a preferred material being a Sr:thiogallate phosphor. Different materials can also be used for absorbing UV light and re-emitting blue light, with a preferred material being ZnS or BaMgAl$_{10}$O$_{17}$ doped with appropriate impurities. The LEDs 12,14, submount 16, and conversion material 22 can be encased in and protected by a clear epoxy 24 that fills the metal cup 16.

When the appropriate electrical signal is applied to the lamp 10, the UV and red LEDs 12, 14, emit light at their respective characteristic spectrum. At least some of the UV light is absorbed by the conversion material 22 and re-emitted as green and blue light. The combination of blue, green light from the conversion material, and red light from the red LED, provides white light with high efficacy and color rendering that appears white when viewed by the human eye.

The lamp 10 shows the combination of a blue and green light being re-emitted from the conversion material, but in an alternative embodiment according to the present invention, a yellow emitting phosphor can be used instead of green. A full range of broad yellow spectral emission is possible using phosphors based on the (Gd, Y)$_3$(Al, Ga)$_5$O$_{12}$:Ce system. These phosphors are stable and typically display high conversion efficiency when excited using UV light. The combination of light from these phosphors, along with light from the blue emitting phosphor and red LED provide a versatile white lamp with high efficacy and high color rendering.

Using a UV emitter 12 with a conversion material 22 to convert UV to blue/green or blue/yellow light has a number of advantages. Higher efficiency UV emitters are available compared to blue or green emitters and in the case of solid-state lasers, short wavelength lasers are more easily achieved than blue lasers. Also, a wider variety of high efficiency phosphors are available which can be excited by short wavelength radiation (250–400 nm).

Figure 2:
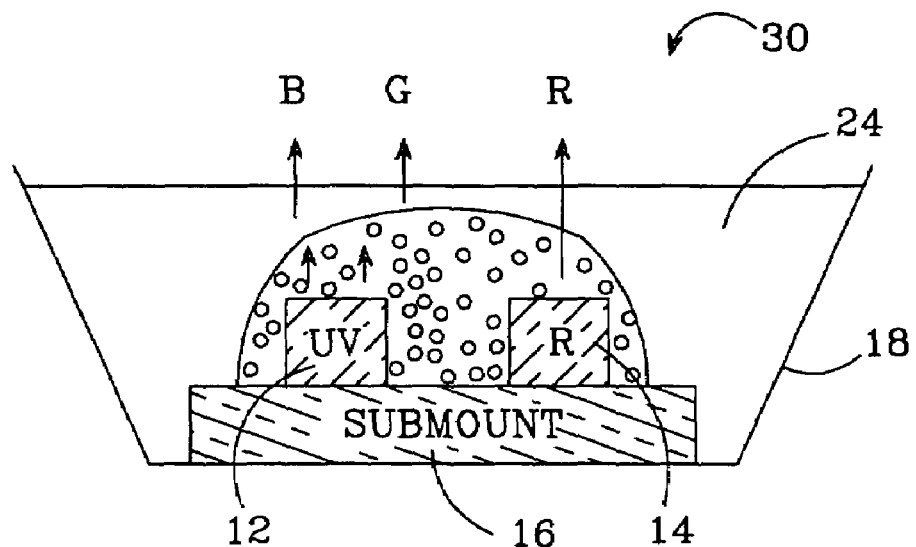
FIG. 2 is a sectional view of another embodiment of a lamp according to the present invention that is similar to the lamp in FIG. 1, with the conversion material also covers the red LED.

FIG. 2 shows another embodiment of a solid state white lamp 30 according to the present invention. It has the same submount 16, first UV LED 12, second red LED 14, metal cup 18 and epoxy 24. However, the lamp 30 has a conversion material 32 that covers both the UV and red LEDs 12, 14, with the conversion material absorbing the UV light and re-emitting in the blue and green wavelength spectrum. Most of the light emitted by the red LED is not absorbed by the conversion material, and passes through to contribute to emission by the lamp 30.

To maximize the uniformity of the overall emission from the lamp 30 (color as a function of viewing angle) the UV and red LEDs 12, 14 can be placed as close together as practical. By covering both the LEDs 12, 14 with the conversion material 32, the manufacturing problems and reduced yield associated with covering only one LED, can be avoided. However, covering the red LED with the conversion material may result in some of the red light being absorbed as it passes through the conversion material.

Figure 3:
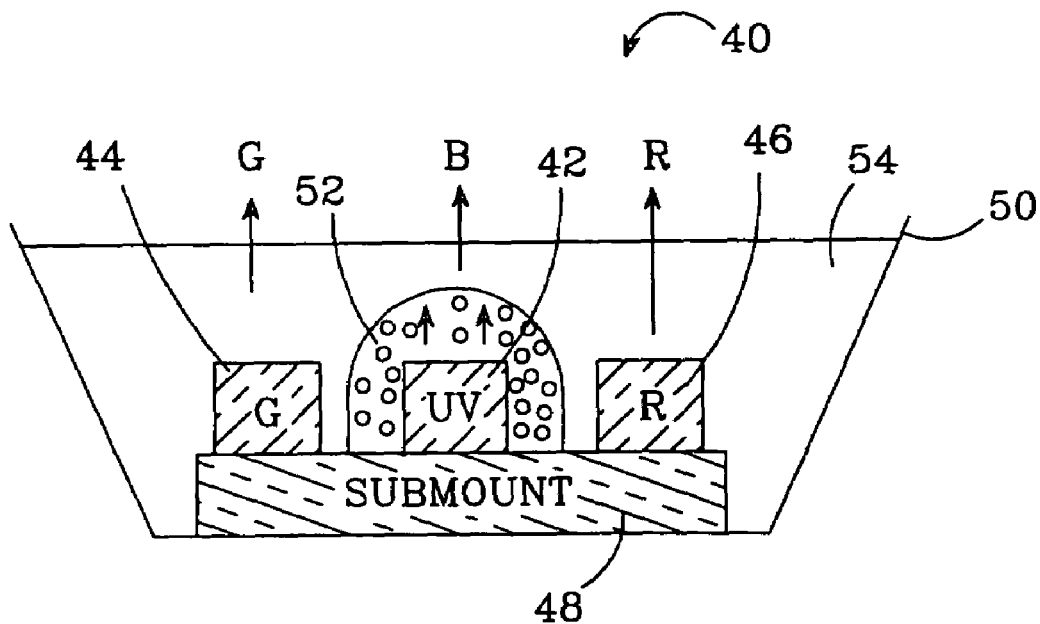
FIG. 3 is a sectional view of another embodiment of a lamp according to the present invention comprising a green LED, red LED, UV LED, and conversion material covering the UV LED.
Figure 4:
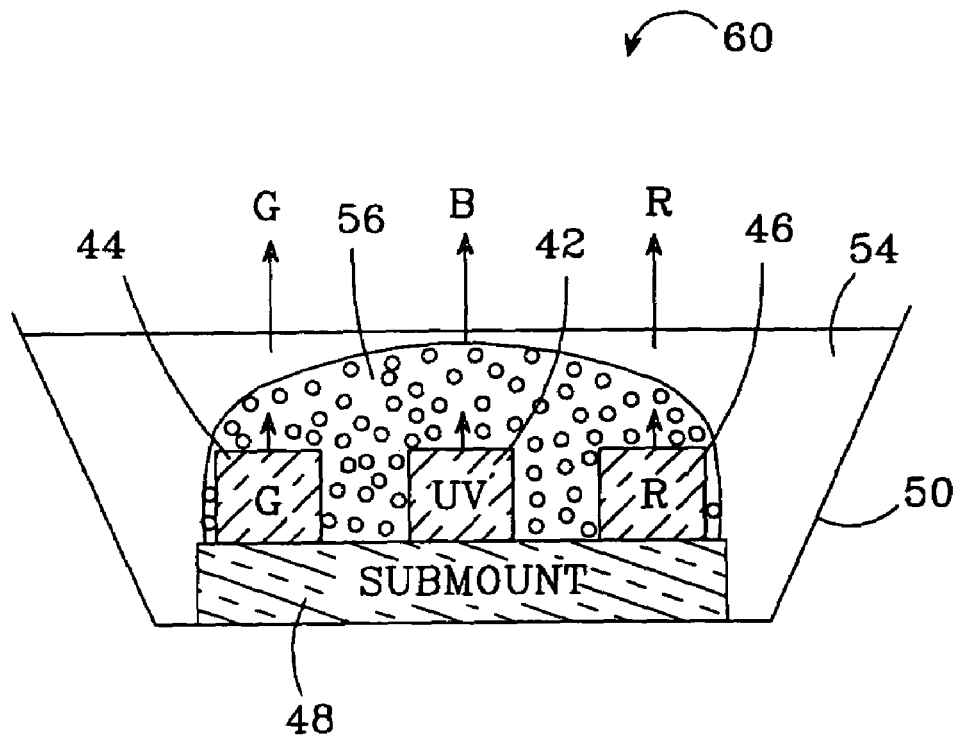
FIG. 4 is a sectional view of another embodiment of a lamp according to the present invention that is similar to the lamp in FIG. 3, with the conversion material covering all of the LEDs.

FIGS. 3 and 4 show additional embodiments of a lamp 40, 60, according to the present invention, with each of the lamps having a UV emitter 42, used in combination with complimentary green and red emitters 44, 46. The emitters are preferably LEDs, although other devices can also be used. Each of the LEDs 42, 44, 46 is mounted on a submount 48 similar to the submount 16 in FIGS. 1 and 2, and in each embodiment the submount 48 is mounted at the base of a metal cup 50 that is similar to the metal cup 18 in FIGS. 1 and 2. The cup 50 includes conductive paths (not shown) for applying a bias across the LEDs 42, 44, 46, to cause each of them to emit light. The bias can either be applied directly to the emitters or can be applied through the submount 48 and its electronic circuitry. The lamps 40 and 60 can also be encased in an epoxy 54 that fills the cup 50 to cover and protect the lamp components.

With the appropriate signal applied to the lamp 40 in FIG. 4, the LEDs 42, 44, 46 produce light at their respective wavelength spectrum. The UV emitter 42 is covered by a blue conversion material 52 made of ZnS or BaMgAl$_{10}$O$_{17}$ doped with appropriate impurities or another suitable blue-converting material, such that at least some of the UV light from the UV emitter 42 is absorbed by the conversion material 52 and re-emitted as blue light. The lamp 40 simultaneously radiates blue, green and red light, which combine to produce a white light having high efficacy and high color rendering.

In the lamp 60 of FIG. 4, all of the LEDs 42, 44, 46 are covered by the blue conversion material 56. Light from the UV LED 42 is absorbed by the conversion material 56 and re-emitted as blue light. Most of the light from the green and red LEDs 44, 46 passes through the conversion material 56 without being absorbed, such that the lamp 60 emits a white combination of the blue, green and red light.

Figure 5:
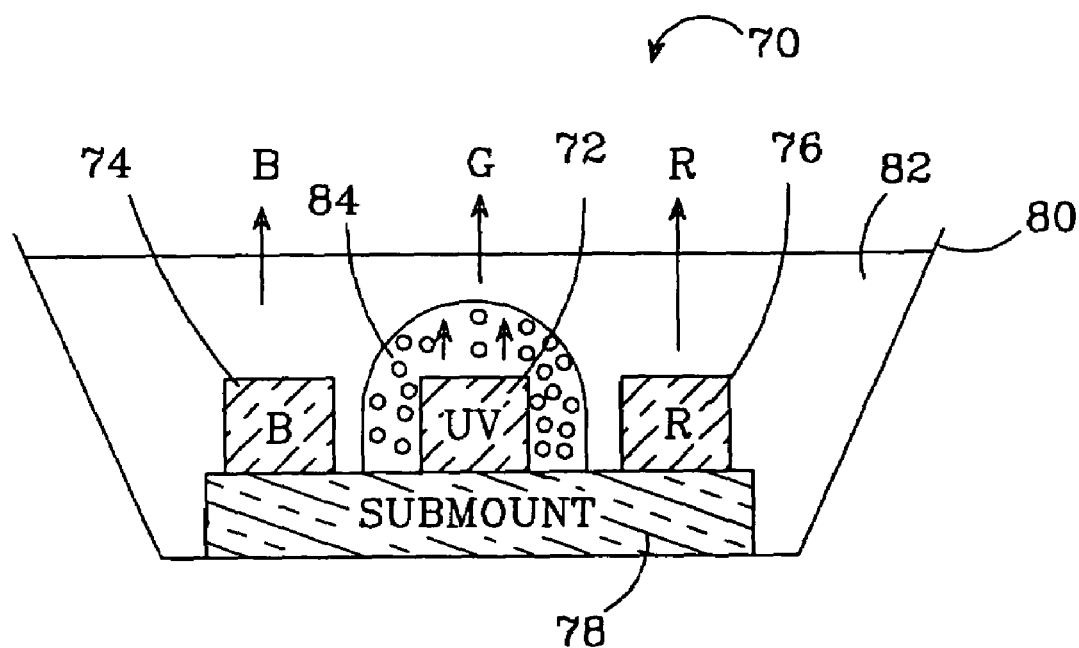
FIG. 5 is a sectional view of another embodiment of another lamp according to the present invention comprising a blue LED, red LED, UV LED, and conversion material covering the UV LED.
Figure 6:
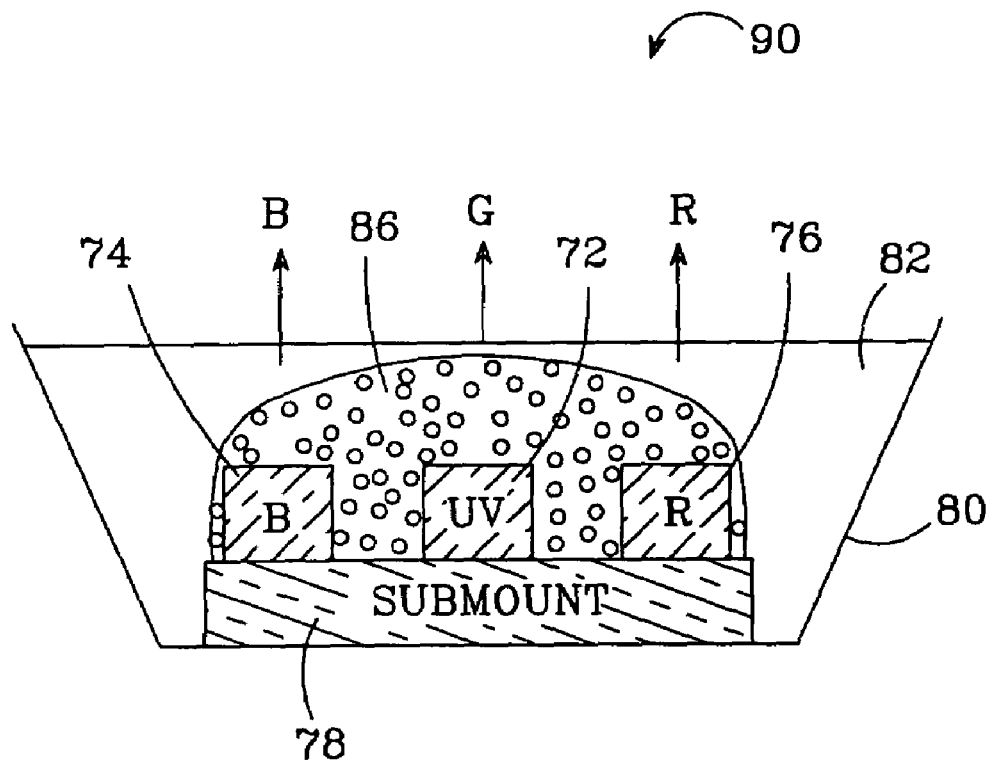
FIG. 6 is a sectional view of another embodiment of a lamp according to the invention that is similar to the lamp in FIG. 5, with the conversion material covering all of the LEDs.

FIGS. 5 and 6 show additional embodiments of a lamp 70, 90, according to the present invention, with each having a UV emitter 72, used in combination with a blue emitter 74 and a red emitter 76. Each of the emitters 72, 74, 76 is preferably an LED and each is mounted on a submount 78 similar to the submount 16 in FIGS. 1 and 2. In each embodiment the submount 78 is mounted at the base of a metal cup 80 that is similar to the cup 18 in FIGS. 1 and 2. Conductive paths (not shown) are included for applying a bias across the LEDs 72, 74, 76, to cause each of them to emit light. Each of the lamps also includes a clear epoxy 82 to cover and protect the lamp components.

In lamp 70, the UV LED 72 is covered by a conversion material 84 (e.g. thiogallate phosphor) that absorbs UV light and re-emits green light. In lamp 90 a similar conversion material 86 covers the UV LED 72 and also covers the red and blue LEDs 74, 76. For lamps 70, 90 the LEDs 72, 74, 76 emit in their respective wavelength spectrums when a bias is applied and the UV wavelength light from each UV LED 72 is absorbed by the respective conversion material 84, 86 and re-emitted as green light. In lamp 70 the green light combines with the direct light from the blue and green emitters 74, 76. In lamp 90 the green light combines with the blue and red light that passes through the conversion material 86. In either case, the lamps 70, 90 emit a white light combination of red, blue and green.

Depending on the application of each of the lamp embodiments described above, it may be desirable to arrange the particular conversion material such that it absorbs essentially all of the UV light from its particular UV emitter. UV light is not useful for illumination and at certain intensity levels can be harmful to eyes or skin.

In the embodiments above a single LED is shown for each type of LED, but the optimal arrangement may require a plurality of LEDs of one or both types. Further, the LEDs shown can have larger or smaller emission areas.

Solid State Laser Emitters

Figure 7:
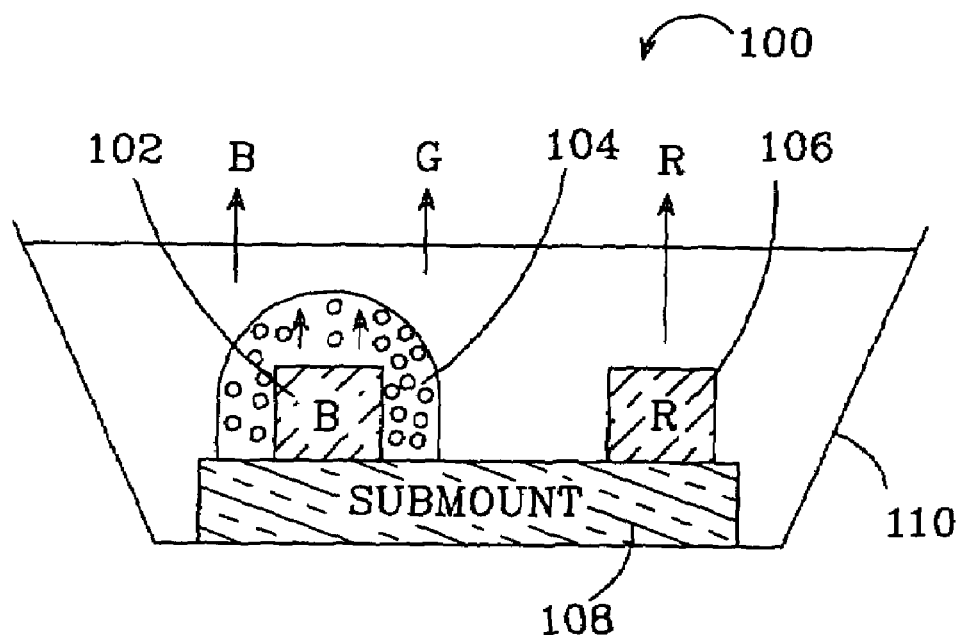
FIG. 7 is a sectional view of another embodiment of a lamp according to the present invention, with a red LED, blue laser and conversion material covering the blue laser.

FIG. 7 shows another embodiment of a lamp 100 according to the present invention. It comprises a solid-state laser 102 and a complimentary second emitter 106 that are both mounted to a submount 108 similar to the submounts described above. Conductive paths can be included to apply a bias across the laser 102 and second emitter 106, and the device can then be mounted to the bottom of a metal cup 110, filled with epoxy. A conversion material 104 is included that covers the laser 102 and absorbs blue light and re-emits in a different wavelength spectrum than the light from the laser 102.

For the lamp 100, the laser 102 preferably emits blue wavelength spectrum, although other types of lasers can be used. The conversion material 104 is preferably made of a material that absorbs blue light and re-emits green light. The emitter 106 is preferably a LED that emits in the red light spectrum. When a bias is applied across the laser 102 and the LED 106, the laser 102 emits in the blue light wavelength spectrum and a suitable amount of conversion material 104 is included so that less than all of the blue light is absorbed by the conversion material 104 and some of the blue light passes through. The red LED 106 emits red light and the conversion material 104 re-emits green light such that the lamp 100 emits a white light combination of the red, green and blue light, with high efficacy and good color rendering.

Lasers have the advantage of emitting a coherent light source that can be selectively scattered or directed. As lasers are further developed they may become preferable over LEDs, because they have the potential for higher efficiency and higher output than LEDs.

Figure 8:
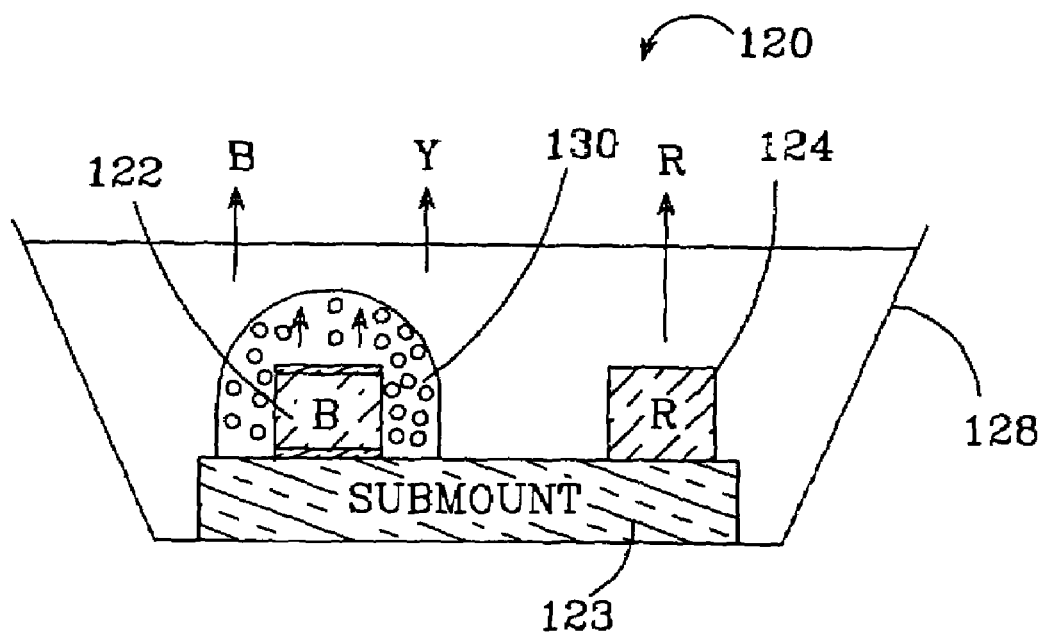
FIG. 8 is a sectional view of another embodiment of a lamp according to the present invention that is similar to the lamp in FIG. 7, with a different conversion material covering the blue laser.

FIG. 8 shows another lamp 120 according to the present invention that is similar to the lamp 100 in FIG. 7. It includes a blue emitting laser 122 and a red emitter 124 that is preferably a LED. The laser 122 and red LED 124 are mounted to a submount 123, and the submount 123 can then be mounted to the bottom of a metal cup 128. In lamp 120, the blue laser 122 is covered by a yellow conversion material 130 that absorbs blue light and re-emits yellow light. When the laser 122 and red LED 124 are emitting, the yellow conversion material 130 absorbs some of the blue light and emits yellow light such that the lamp 100 emits a white light combination of blue, yellow and red light having good efficacy and color rendering.

Figure 9:
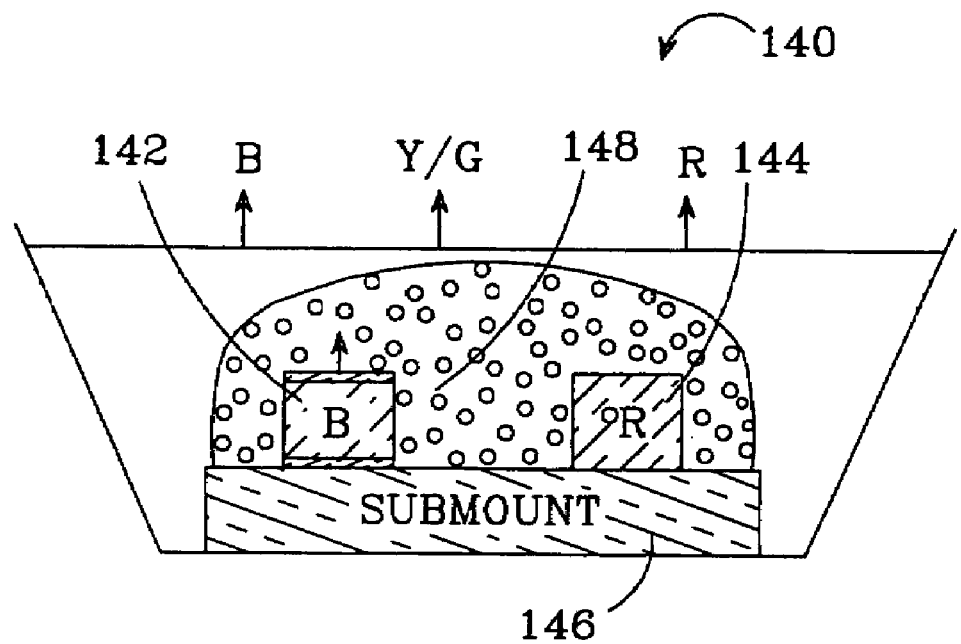
FIG. 9 is a sectional view of another embodiment of a lamp according to the present invention that is similar to the lamp in FIG. 7 or 8, with the conversion material also covering the red LED.

For each of the embodiments described, the conversion material can cover the laser and complimentary LED. For instance, FIG. 9 shows another embodiment of a lamp 140 according to the present invention that includes a blue emitting laser 142 and a red emitting LED 144 mounted on a submount 146. A conversion material 148 covers the laser 142 and the red LED 144. The conversion material 148 contains material that absorbs some of the lasers blue light and re-emits green (or yellow). Most of the light from the red LED 144 passes through the conversion material 148 such that the lamp 140 emits a white light combination of blue, green (or yellow) and red light.

Figure 10:
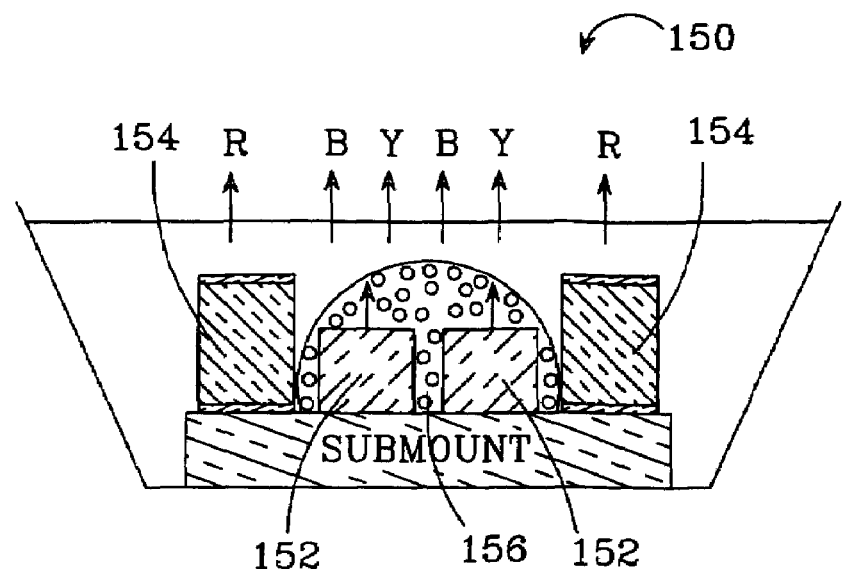
FIG. 10 is a sectional view of another embodiment of a lamp according to the present invention comprising blue LEDs covered by a yellow conversion material and two red lasers.

Many different types of lasers and LEDs can be used that emit in different wavelength spectrums. Many different combinations of laser embodiments of lamps according to the present invention can be realized with many different numbers of lasers or LEDs. For example, FIG. 10 shows another embodiment of a similar lamp 150 according to the present invention having two blue emitting LEDs 152 between two red solid-state lasers 154. The blue LEDs 152 are covered by a conversion material 156 that absorbs blue light and re-emits green light. As the LEDs 152 and lasers 154 emit light, the conversion material absorbs some of the blue light such that the lamp 150 emits a white light combination of blue, green and red light. In an alternative embodiment (not shown), the conversion material 156 covers the blue LEDs 152 and the red lasers 154. Alternatively, blue LEDs may be combined with red lasers, with at least some of the light emitted from the blue laser converted to light of another wavelength by a downconverting media according to the present invention.

Large Area Emitters Combined With Multiple Emitters

The prior art lamps, as well as some of the lamps described above, can produce a projected light that can have an asymmetric appearance. For instance, lamp embodiments with a blue emitter, conversion material, and red emitter, can appear as though the projected light is more red on one side and more blue on the other.

This is a particular problem with large area LEDs that are useful for high-power, high output lamps. Higher current levels can be applied to larger LEDs which results in higher luminous flux. Multiple large area LEDs can be used in solid-state lamps that can operate at high power levels up to 5–70 Watts and beyond. When complimentary LEDs are placed side by side to the large area LED, the lamp tends to produce white light that is not balanced.

To help provide a more symmetric appearance to the projected light, multiple complimentary LEDs can be used to surround each large area LED (or to surround a group of large area LEDs) such that the high luminous flux of the large area LED is balanced by the surrounding LEDs. This type of arrangement in a single package can also provide advantages in heat sinking, compactness and color mixing.

Figure 11:
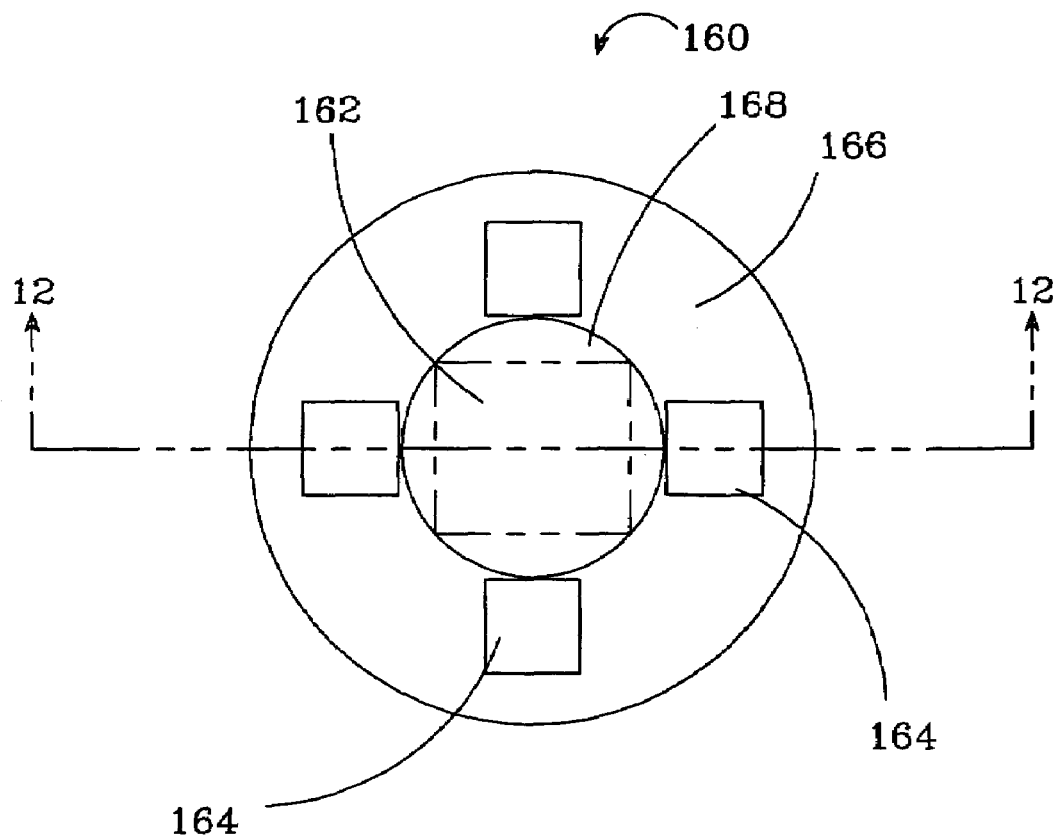
FIG. 11 is a plan view of another embodiment of a lamp according to the present invention comprising a large area LED surrounded by complementary LEDs.
Figure 12:
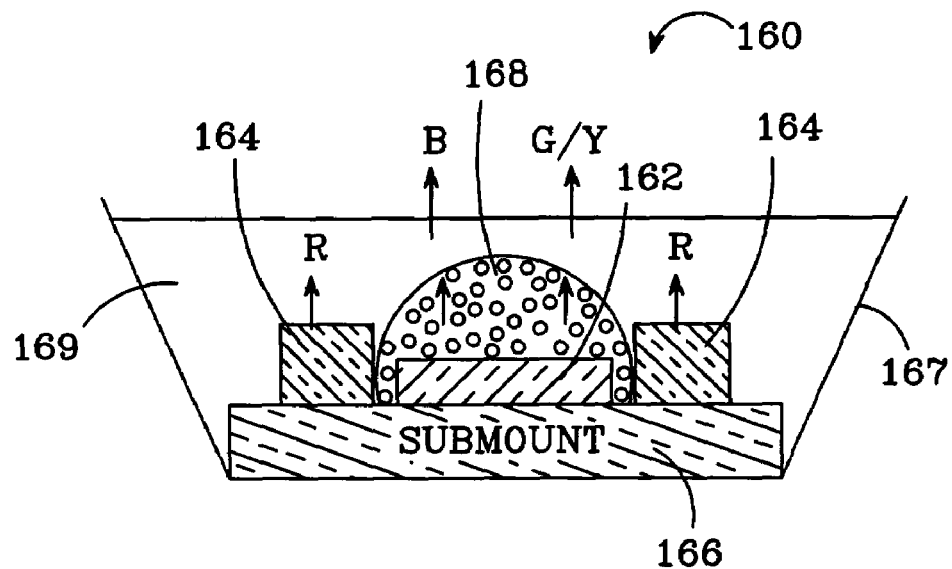
FIG. 12 is a sectional view of the lamp in FIG. 11, taken along section lines 12—12.

To illustrate this arrangement, FIGS. 11 and 12 show a lamp 160 according to the present invention having a large area LED 162 surrounded by a plurality of complimentary LEDs 164. The LEDs are mounted to a submount 166, which can then be mounted to the base of a metal cup 167. Many different large area LEDs can be used, with a suitable large area LED 164 being a blue emitting LED. A conversion material 168 covers the LED 162 with the preferred conversion material 168 absorbing the blue light and re-emitting yellow light. In another embodiment of the lamp 160, the conversion material 168 absorbs blue light and re-emits green light. The surrounding LEDs 164 emit red light and are spaced around the LED 162 in a sufficient number to provide a balance to the high flux of the LED 162 such that the lamp emits a balanced white light. The lamp 160 has four surrounding LEDs 164 around the large area LED 162, but a different number of surrounding LEDs 164 can be used depending on the intensity of the large area LED 162, and the size and intensity of the surrounding LEDs 164. When the large area LED 162 and surrounding LEDs 164 are emitting, the lamp 160 emits a balanced white light combination of the blue, green and red light.

Similar to the embodiments above, the components of the lamp 160 can be encased in epoxy 169 and the submount 166 and/or metal cup 167 can have conductors to apply a bias to the LEDs 162, 164. Also, in alternative embodiments of the lamp 160, the conversion material can cover all the LEDs 162, 164 and different colors of LED 162, 164 can be used.

Scattering Particles

To improve the uniformity of light emitting from the lamps described above, it can be desirable to scatter the light as it emits from the various emitters. One way to scatter light is by using scattering particles that randomly refract light. To effectively scatter light, the diameter of these particles should be approximately one half of the wavelength of the light being scattered. In air, this would result in the particles being approximately 0.2 to 0.25 microns in diameter and the diameters would be smaller if the particles are in a medium having a different index of refraction than air such as epoxy.

In the lamps described above, a conversion material typically surrounds at least one of the emitters and typically comprises phosphor particles. The conversion efficiency of phosphors generally decreases as the size of the phosphor particles decrease. As a result, it is difficult to obtain high conversion efficiency phosphors particles that are smaller than approximately 1 micron in diameter, making phosphor particles generally too large to effectively scatter light.

To produce more uniform light emission in white emitting lamps described above (and prior art lamps) scattering particles can be included such that light from the emitters passes through them and is refracted to mix the light and provide an overall light emission that is more uniform in color and intensity. The scattering particles can be arranged in different locations, such as in the conversion material or epoxy, or the particles can form their own layer. The preferred scattering particles would not substantially absorb light at any of the wavelengths involved and would have a substantially different index of refraction than the material in which it is embedded (for example, epoxy) The scattering particles should have as high of an index of refraction as possible. Suitable scattering particles can be made of titanium oxide ($TiO_2$) which has a high index of refraction (n=2.6 to 2.9) and is effective at scattering light. Since the primary requirement for the scattering "particles" is that they have a different index of refraction from their surrounding material and that they have a particular size range, other elements such as small voids or pores could also be used as "scattering particles".

Figure 13:
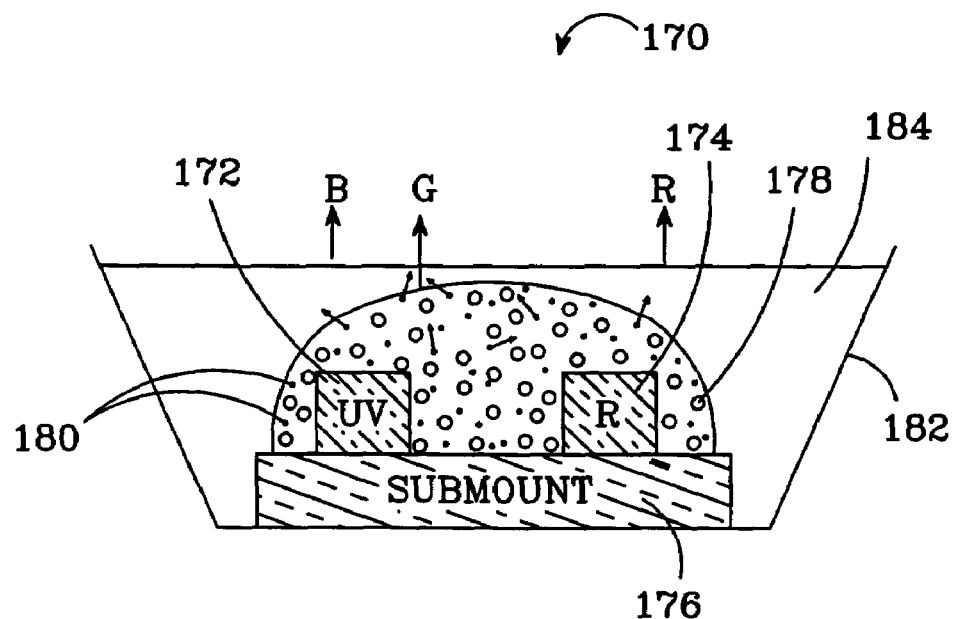
FIG. 13 is a sectional view of another embodiment of a white emitting lamp according to the present invention comprising scattering particles in its conversion material.

FIG. 13 shows one embodiment of a lamp 170, according to the present invention, having a UV emitting LED 172 and red emitting LED 174 mounted on a submount 176 along with the necessary conductive paths. A conversion material 178 is included that covers both the UV and red LEDs 172, 174 such that light from the LEDs passes through the conversion material 178. The conversion material 178 contains scattering particles 180 disposed to refract the light passing through the conversion material 178. Each of the scattering particles 180 can be similarly sized so that they primarily scatter a single wavelength of light, such as from the UV LED 72, or they can have different sizes to scatter light of different wavelengths of light, such as from the LEDs 172, 174 and the conversion material 178. Like the embodiments above, the LEDs 172, 174, conversion material 178, and submount 176 are in a metal cup 182 and are encased in an epoxy 184.

Figure 14:
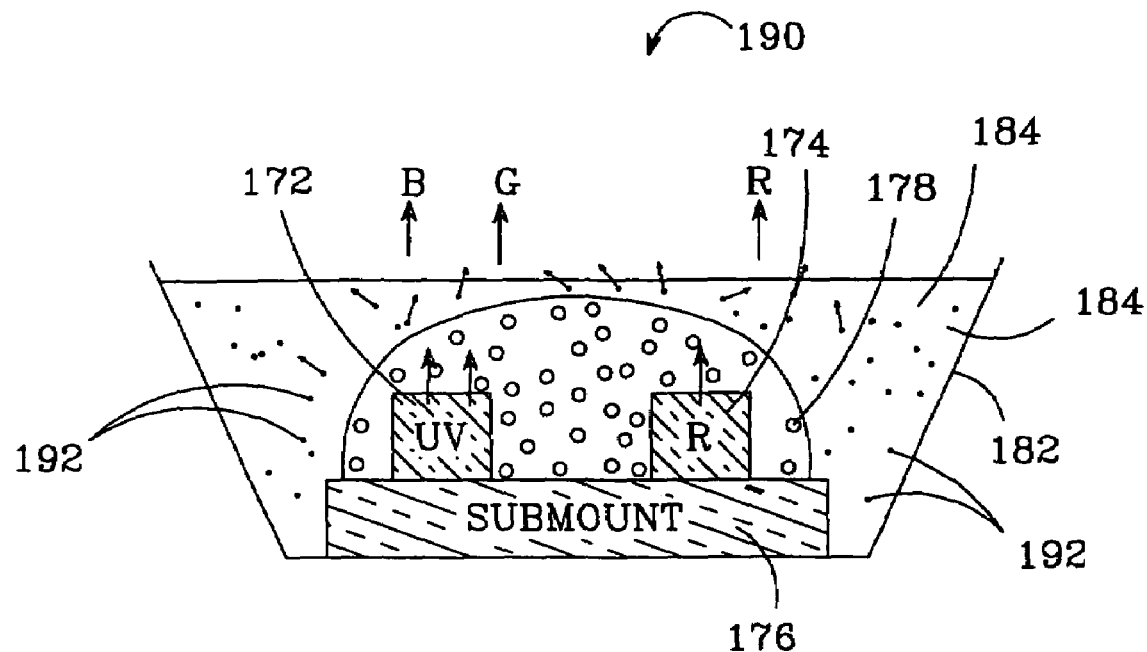
FIG. 14 is a sectional view of another embodiment of a lamp according to the present invention comprising scattering particles in its epoxy.
Figure 15:
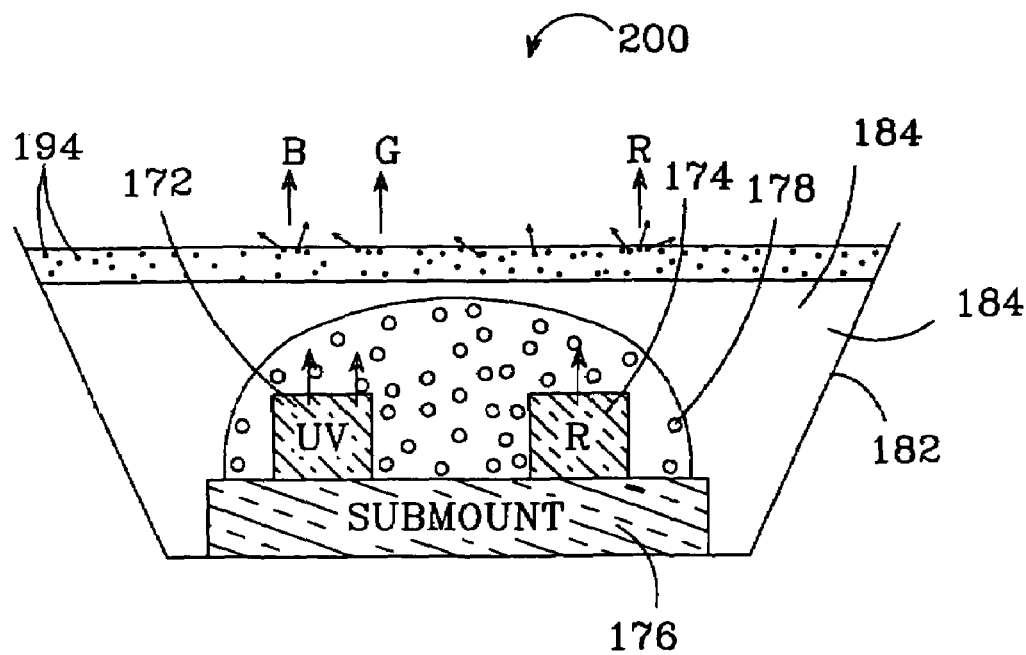
FIG. 15 is a sectional view of another embodiment of a lamp according to the present invention comprising a layer of scattering particles.

FIGS. 14 and 15 show two additional embodiments of a lamp 190, 200, according to the present invention. Each lamp 190, 200 has a UV and red LED 172, 174, a submount 176, and a conversion material 178, all of which are in a metal cup 182 and epoxy 184. However, for lamp 190, the scattering particles 192 are disposed in the epoxy 184. For lamp 200, the scattering particles 194 are formed in a layer on top of the epoxy 184. The light from the LEDs 172, 174 and conversion material 176 passes through the scattering particles 192, 194 where different wavelengths of light can be refracted depending on the size and material of the particles 192, 194. Like the lamp 170 in FIG. 13, the scattering particles 192, 194 can be similarly sized or can have different sizes depending on the wavelength of light emitted from the LEDs 172, 174 and the conversion material 176.

Miscellaneous Features

Figure 16:
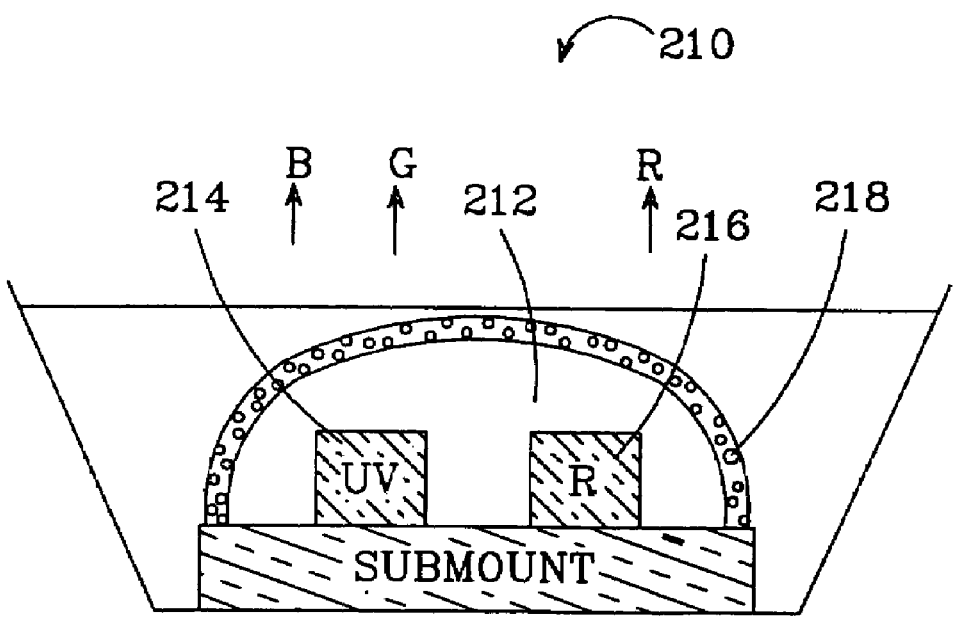
FIG. 16 is a sectional view of another embodiment of a lamp according to the present invention comprising a clear/transparent material between the emitters and conversion material.

Other lamp features according to the present invention can improve light extraction from the lamps described above. FIG. 16 shows another embodiment of a lamp 210 according to the present invention having a clear material 212, such as an epoxy, arranged over the emitters 214, 216, which in this embodiment are UV and red emitting LEDs respectively. The material 212 preferably forms a hemispheric volume with the LED 212, 216 as close as practical to the origin of the hemisphere. The hemisphere should have a large radius compared to the dimensions of the LEDs. The material 212 preferably has an index of refraction approximately the same as the primary surfaces of the LEDs 214, 216 from which most of the light is emitted (e.g. the substrate for flip-chip LEDs or the top surface for a standard LED). A layer of conversion material 218 is then included on the surface of the clear layer 212. This arrangement minimizes reflection of light at the interface between the LED surfaces and the clear layer 212, and the clear layer 122 and layer of conversion material 218, back into the LED active layers where the light can be absorbed.

In the lamp embodiments according to the present invention, the intensities of the individual LEDs (and lasers) can be controlled. This can be accomplished by controlling the relative emission of the LEDs through control of the applied current, and controlling the blue/green emission of the conversion material by controlling the amount and location of the conversion material. This type of control allows the lamps to emit at color points not accessible using the blue LED/yellow phosphor approach. This control/adjustability could also enhance manufacturing yield by selecting and matching the emission characteristics of the different LEDs (peak emission wavelength, etc.), thereby allowing the fabrication of lamps having very tight spectral distribution (color, hue, etc.) over a large range of color temperature. Similarly, by controlling the relative power applied to the respective LEDs or the amount of phosphor applied, a large range of flexibility is available both for providing the desired chromaticity and controlling the color output of the individual devices. A lamp according to the invention could be provided that allows the end user to control the relative powers applied to the respective LEDs. The lamp could be "tuned" by the user to achieve desired colors or hues from a single lamp. This type of control can be provided by known control electronics.

The lamps according to the present invention can also include lenses and facets to control the direction of the lamp's emitting light. Other components could be added related to thermal management, optical control, or electrical signal modification and control, to further adapt the lamps to a variety of applications.

Although the present invention has been described in considerable detail with reference to certain preferred configurations thereof, other versions are possible. As mentioned above, different LEDs that emit at different colors can be used in embodiments described above. In those embodiments where one emitter is described as providing light in a particular wavelength spectrum, two or more emitters can be used. The conversion materials described above can use many different types of material that absorb different wavelengths of light and re-emit different wavelengths beyond those described above. Therefore, the spirit and scope of the appended claims should not be limited to their preferred versions contained therein.

We claim:

1. A white light emitting lamp, comprising:
a solid state ultra violet (UV) emitter emitting light in the UV wavelength spectrum;
a conversion material at least partially covering said UV emitter and arranged to absorb at least some of the light emitting from said UV emitter and re-emit light at one or more different wavelength spectrums of light; and
one or more complimentary solid state emitters substantially uncovered by said conversion material and emitting different wavelength spectrums of light than said UV emitter and said conversion material, said lamp emitting a white light combination of light emitted from said complimentary emitters and from said conversion material, said white light having high efficacy and good color rendering;

said UV and complimentary emitters being mounted in a reflector element having conductors to apply a bias to said emitters, said bias causing said emitters to emit light.

2. The lamp of claim 1, wherein said UV emitter comprises a UV emitting light emitting diode (LED), said conversion material absorbs at least some of the light emitting from said UV LED and re-emits wavelengths of light in the blue and green spectrum.

3. The lamp of claim 1, wherein said one or more complimentary emitters comprise a LED emitting a wavelength of light in the red spectrum.

4. The lamp of claim 1, wherein, said UV emitter comprises a UV emitting LED and said conversion material absorbs at least some of the light emitting from said UV LED and re-emits wavelengths of light in the blue spectrum.

5. The lamp of claim 1, wherein said one or more complimentary emitters comprise a LED emitting a wavelength of light in the green spectrum and a LED emitting a wavelength of light in the red spectrum.

6. The lamp of claim 1, wherein said UV emitter comprises a UV emitting LED and said conversion material absorbs at least some of the light emitting from said UV LED and re-emits wavelengths of light in the green spectrum.

7. The lamp of claim 1, wherein said one or more complimentary emitters comprises a LED emitting a wavelength of light in the green spectrum and a LED emitting a wavelength of in the red spectrum.

8. The lamp of claim 1, wherein said conversion material covers both said UV emitter and said one or more complimentary emitters, most of the light from said complimentary emitters passing through said conversion material without being absorbed.

9. The lamp of claim 1, wherein said UV and complimentary emitters are mounted on a submount.

10. The lamp of claim 1, wherein said UV and complimentary emitters each comprise an emitter from the group consisting of an LED, a solid state laser, and organic light emitting diode.

11. A white light emitting lamp, comprising:
a solid state ultra violet (UV) emitter emitting light in the UV wavelength spectrum;
a conversion material arranged to absorb at least some of the light emitting from said UV emitter and re-emit light at one or more different wavelength spectrums of light;
one or more complimentary solid state emitters emitting different wavelength spectrums of light than said UV emitter and said conversion material, said lamp emitting a white light combination of light emitted from said complimentary emitters and from said conversion material, said white light having high efficacy and good color rendering, said UV and complimentary emitters being mounted in a reflector element having conductors to apply a bias to said emitters, said bias causing said emitters to emit light; and
scattering particles arranged to scatter the light from said UV and complimentary emitters to produce a substantially uniform emission of white light from said lamp, said scattering particles each having a diameter of approximately one half a wavelength of light emitted by either said UV emitter or said complimentary emitters.

12. A white light emitting lamp, comprising:
a solid state ultra violet (UV) emitter emitting light in the UV wavelength spectrum;
a conversion material arranged to absorb at least some of the light emitting from said UV emitter and re-emit light at one or more different wavelength spectrums of light;
one or more complimentary solid state emitters emitting different wavelength spectrums of light than said UV emitter and said conversion material, said lamp emitting a white light combination of light emitted from said complimentary emitters and from said conversion material, said white light having high efficacy and good color rendering, said UV and complimentary emitters being mounted in a reflector element having conductors to apply a bias to said emitters, said bias causing said emitters to emit light; and
a layer of clear material between said UV emitter and said conversion material, said clear layer forming a hemispheric or sheet volume.

13. The lamp of claim 12, wherein said layer of clear material has an index of refraction approximately the same as that of the emitting surface of said UV emitter.

14. A white light emitting lamp, comprising:
a solid state ultra violet (UV) emitter emitting light in the UV wavelength spectrum;
a conversion material arranged to absorb at least some of the light emitting from said UV emitter and re-emit light at one or more different wavelength spectrums of light; and
one or more complimentary solid state emitters emitting different wavelength spectrums of light than said UV emitter and said conversion material, said lamp emitting a white light combination of light emitted from said complimentary emitters and from said conversion material, said white light having high efficacy and good color rendering, said UV and complimentary emitters being mounted in a reflector element having conductors to apply a bias to said emitters, said bias causing said emitters to emit light, wherein the intensities of the light emitted from said UV emitter and complimentary emitters can be independently varied to vary the color or hue of white light emitted from said lamp.

15. The lamp of claim 1, further comprising a component to control the direction of light emitted from said lamp.

16. The lamp of claim 1, wherein said conversion material comprises a material from the group consisting of a phosphor, fluorescent dye, photoluminescent semiconductor, and combinations thereof.

17. The lamp of claim 1, wherein said conversion material absorbs substantially all the light emitting from said UV emitter.

18. The lamp of claim 1, wherein said UV emitter comprises a plurality of large area LED and said complimentary emitters comprise a plurality of LEDs surrounding said large area LED, said lamp emitting a balanced white light.

19. A white light emitting lamp, comprising:
a solid state laser emitting light in a first wavelength spectrum;
a conversion material at least partially covering said solid state laser and arranged to absorb at least some of the light emitting from said laser and re-emit light at one or more different wavelength spectrums of light; and one or more complimentary solid state emitters emitting different wavelengths of light than said laser and said conversion material, said lamp emitting a white light combination of light emitted from said laser, complimentary emitters, and conversion material, said white light having high efficacy and good color rendering;

said laser emitting light in the blue wavelength spectrum, said conversion material absorbing some of the light emitting from said laser and re-emitting a wavelength of light in the green spectrum, the non-absorbed blue light passing through said conversion material.

20. The lamp of claim 19, wherein said one or more complimentary emitters comprise a LED emitting a wavelength of light in the red spectrum.

21. The lamp of claim 19, wherein said conversion material absorbs some of the light emitting from said laser and re-emits a wavelength of light in the blue and yellow spectrum, the non-absorbed blue light passing through said conversion material.

22. The lamp of claim 19, further comprising a submount and metal cup, said laser and complimentary emitters mounted on said submount and said submount mounted in said reflector element.

23. The lamp of claim 19, further comprising scattering particles arranged to scatter the light from said laser and complimentary emitters to produce a more uniform emission of white light from said lamp.

24. The lamp of claim 19, wherein the intensities of the light emitted from said laser and complimentary emitters can be independently varied to vary the color or hue of white light emitted from said lamp.

25. The lamp of claim 19, wherein said conversion material comprises a material from the group consisting of a phosphor, fluorescent dye, photoluminescent semiconductor, and combinations thereof.

26. A white light emitting lamp, comprising:
a first solid state emitter emitting light in a first wavelength spectrum;
a conversion material to absorb at least some of the light from said first solid state emitter, and emit light at one or more different wavelength spectrums;
one or more complimentary emitters each of which emits light at a wavelength spectrum different from said first wavelength spectrum and said conversion material wavelength spectrums; and
scattering particles arranged to scatter the light from said first emitter, conversion material and complimentary emitters, said lamp emitting a uniform white light combination of light from said first emitter, conversion material and complimentary emitters;
said scattering particles each having a diameter of approximately one half a wavelength of light emitted by either said first emitter, conversion material or complimentary emitters.

27. The lamp of claim 26, wherein said scattering particles are disposed within said conversion material.

28. The lamp of claim 26, further comprising a clear encapsulant material, said encapsulant encasing at least part of said lamp with at least some of the light from said first emitter, conversion material and complimentary emitters passing through said encapsulant, said scattering particles disposed within said encapsulant.

29. The lamp of claim 26, wherein said scattering particles form a layer of scattering particles with at least some of the light from said first emitter, conversion material and complimentary emitters passing through said layer.

30. The lamp of claim 26, wherein the white light emitted by said lamp has high efficacy and good color rendering.

31. A high flux white emitting lamp, comprising:
a large area light emitting diode (LED) emitting light at a first wavelength spectrum;
a conversion material arranged to absorb at least some of the light from said large area LED, and re-emit at least one wavelength light in a spectrum different from said first wavelength spectrum; and
a plurality of complimentary solid state emitters surrounding said large area LED and each emitting light in a spectrum different from said large area LED and said conversion material, said lamp emitting a balanced and uniform white light combination of light from said large area LED, conversion material and complimentary emitters, said white light having high efficacy and good color rendering;
said conversion material covering both said large area LED and said plurality of complimentary emitters, most of the light from said complimentary emitters passing through said conversion material without being absorbed.

32. The lamp of claim 31, further comprising a submount and reflector element, said large area LED and complimentary emitters mounted on said submount and said submount mounted in said metal cup.

33. The lamp of claim 31, further comprising scattering particles arranged to scatter the light from said large area LED and complimentary emitters to produce a substantially uniform emission of white light from said lamp.

34. The lamp of claim 31, wherein the intensities of the light emitted from said large area LED and complimentary emitters can be independently varied to vary the color or hue of white light emitted from said lamp.

35. The lamp of claim 31, wherein said large area LED comprises a plurality of large area LEDs.

36. A method for producing white light with high efficacy and good color rendering, comprising:
generating light in the UV wavelength spectrum from a UV light source;
passing said UV light through a conversion material in contact with said UV light source that absorbs said UV light and re-emits light at one or more different wavelength spectrums;
generating complimentary light at one or more wavelength spectrums that is different from said conversion material wavelength spectrums;
combining said conversion material light and said complimentary light to generate white light with high efficacy and good color rendering; and
providing reflective element that reflects said UV light, complimentary light and conversion material light such that all contribute to light emission direction, said reflective element also comprising a means for causing said light generation.

37. The method of claim 36, further comprising scattering said conversion material light and said complimentary light to generate substantially uniform white light.

38. A method for producing white light with high efficacy and good color rendering, comprising:
generating laser light from a laser light source;
passing said laser light through a conversion material at least partially covering said laser light source that absorbs at least some of said laser light and re-emits light at one or more different wavelength spectrums;

generating complimentary light at one or more wavelength spectrums that is different from said conversion material wavelength spectrums; and combining said conversion material light and said complimentary light to generate white light with high efficacy and good color rendering, said laser light being blue light, said conversion material absorbing some of the light emitting from said laser and re-emitting a wavelength of light in the green spectrum, the non-absorbed blue light passing through said conversion material.

* * * * *